United States Patent [19]

Schulte et al.

[11] Patent Number: 4,729,003
[45] Date of Patent: Mar. 1, 1988

[54] CONFIGURATION OF A METAL INSULATOR SEMICONDUCTOR WITH A PROCESSOR BASED GATE

[75] Inventors: Eric F. Schulte; Adam J. Lewis, both of Richardson, Tex.

[73] Assignee: Texas Instruments Incorporated, Dallas, Tex.

[21] Appl. No.: 849,597

[22] Filed: Apr. 8, 1986

Related U.S. Application Data

[62] Division of Ser. No. 646,659, Aug. 31, 1984.

[51] Int. Cl.⁴ .............................................. H01L 27/14
[52] U.S. Cl. .................... 357/30; 357/23.6; 357/26; 357/41
[58] Field of Search ............... 357/30, 26, 23.6, 41

[56] References Cited

U.S. PATENT DOCUMENTS 4,447,291  5/1984  Schulte ........................... 357/30 X Primary Examiner—Martin H. Edlow
Attorney, Agent, or Firm—Carlton H. Hoel; Leo N. Heiting; Melvin Sharp

[57] ABSTRACT

A method for fabricating a metal insulator semiconductor includes first forming a substrate (10) having an array of switching elements formed therein. A plurality of deformable Indium pads (16) and (18) are then formed on the surface of the substrate and in contact with each of the switching elements. A superstrate is formed from a layer of mercury cadmium telluride (32) and a layer of dielectric insulating material (34). The superstrate is pressed down adjacent the substrate (10) with the upper surface of the conductive gates (16) and (18) contracting the lower surface of the dielectric layer (34). The deformable pads (16) and (18) conform to the lower surface of the dielectric layer (34). Epoxy (36) is then disposed in the interstices of the device to provide an adhesive force between the substrate (10) and the superstrate. The thickness of the mercury cadmium telluride layer (32) is then decreased to reduce the path length for photon generated carriers created at the upper surface to diffuse to the diametrically opposite side.

20 Claims, 7 Drawing Figures

CONFIGURATION OF A METAL INSULATOR SEMICONDUCTOR WITH A PROCESSOR BASED GATE

This is a division of application Ser. No. 646,659, filed Aug. 31, 1984.

TECHNICAL FIELD OF THE INVENTION

The present invention pertains in general to the formation of photodetectors and, more particularly, to a Mercury Cadmium Telluride photodetector.

BACKGROUND OF THE INVENTION

A metal insulator semiconductor (MIS) photodetector is formed by disposing a layer of nonconducting dielectric insulating material between a photosensitive semiconductor material and a metal conductor or gate. A voltage impressed across the dielectric layer results in the formation of a depletion region or MIS well within the semiconductor material which defines a capacitive element. The capacitance of this element is variable in response to photons that enter the lattice of the semiconductor layer. The measurement of this capacitance and the variance thereof provides a method for measuring the number of photons received on a given surface. These elements are normally arranged in an array with each element of the array constituting a pixel. All of the pixels are individually addressable to provide an output signal corresponding to the light impinging thereon. The operation and fabrication of arrays of this type are discussed in more detail in co-pending application Ser. No. 528,207, filed Aug. 31, 1983.

The fabrication of MIS devices heretofore has required the formation of a combined layer of semiconductor material and a layer of insulating dielectric with a metal conductive pad formed on the upper surface thereof. This metal conductive pad is the MIS gate and is semitransparent, such that impinging photons penetrate therethrough to enter the depletion region of the semiconductor material and free lattice electrons therein.

To ensure that a sufficient number of photons enter the depletion region, the semitransparency of the gate and the dielectric layer is a major factor and presents manufacturing and device design problems. One solution to this problem has been to fabricate the MIS device with the layer of photosensitive semiconductor material disposed as a superstrate with respect to the array. The MIS gate is formed with a metal pad disposed beneath the semiconductor layer and bonded to a dielectric insulating layer of the superstrate. The thickness of the semiconductor layer is then reduced to allow photons to enter the depletion region through the top of the superstrate without having to pass through the gate. Fabrication of MIS gates onto the semiconductor/insulator superstrate requires metal deposition and photolithographic patterning techniques which expose the sensitive superstrate materials to potentially damaging mechanical, thermal and ultraviolet radiation stresses. Subsequent mating of patterned superstrate to patterned substrate is a critical and difficult process requiring a large number of high quality ohmic contacts to be made between the substrate circuitry and the superstrate gates. This process presents considerable difficulties.

In view of the above disadvantages, there exists a need for an improved configuration of an MIS array which eliminates passage of the detected photons through the MIS gate and facilitates contact therewith and reduces the risk and difficulty of processing.

SUMMARY OF THE INVENTION

The present invention disclosed and claimed herein comprises a method for fabricating a photodetector array that first includes the fabrication of a substrate, typically a silicon integrated circuit, having a pattern of array switching elements defined therein, each of the array elements selectable for connection to a first external terminal. A plurality of MIS gates are formed on the surface of the substrate, each of the gates in conductive contact with one of the array switching elements. A superstrate is formed from a layer of nonconductive dielectric material disposed on the surface of a layer of photosensitive semiconductor material. The superstrate is disposed adjacent the substrate with the dielectric layer facing the MIS gates; and then the superstrate and substrate are bonded together.

In another embodiment of the present invention, the MIS gates are fabricated from a deformable conductive material to allow conformation of the gate surface with the surface of the dielectric layer. The deformable pads are fabricated from a material such as Indium alloy with the photosensitive semiconductor material consisting of Mercury Cadmium Telluride to provide photon detection over a specific portion of the infrared spectrum. To facilitate the deformation of the Indium alloy pads, heat can be applied simultaneous with pressure when placing the substrate and superstrate together. Additionally, an adhesive material is wicked into the spaces between the MIS gates, substrate surface and dielectric layer surface to prevent separation thereof. MIS gates formed in this fashion have inherently good ohmic contact to the substrate processor circuitry, and are required only to be capacitively coupled to the superstrate by virtue of proximity thereto.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
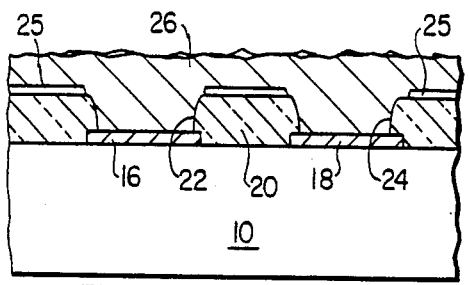
FIG. 1 illustrates a cross-sectional diagram of the formation of the substrate with a layer of Indium alloy formed on the surface thereof.

Referring now to FIG. 1, there is illustrated a cross-sectional diagram of a substrate 10 having a silicon processor formed therein. The silicon processor is an array of switching elements disposed at predetermined locations on the substrate 10. Each of these switching elements is individually addressable to switch the input thereof to a common READ line. The operation of a typical silicon processor is described in more detail in a co-pending application Ser. No. 528,207, filed, Aug. 31, 1983.

The substrate 10 is illustrated in cross-section and the active switching elements are not shown. However, a contact pad 16 and a contact pad 18 are illustrated, which are connected to the inputs of two adjacent switching elements in the array. The contact pads 16 and 18 can be aluminum and are formed by conventional processing techniques.

A protective nitride layer 20 is formed on top of the substrate 10 and the contact pads 16 and 18. An access opening of via 22 is formed through the nitride layer 20 to the contact pad 16 and an access opening or via 24 is formed through the nitride layer 20 to the contact pad 18. A layer of photoresist 25 is patterned on top of the nitride layer 20 and developed to define open areas on top of the access openings 22 and 24 exposing both the access openings 22 and 24 and a portion of the nitride layer 20. A layer of Indium alloy 26 is deposited on the substrate 10 and contacting the contact pads 16 and 18. The Indium alloy layer provides a conductive path to the contact pads 16 and 18 through the access openings 22 and 24. This layer is readily deformable and is built up such that its surface above the access openings 22 and 24 is higher than the structures that constitute the topography of the substrate 10. The Indium alloy utilized to form the layer 26 is fabricated from a combination of Indium, Bismuth, Lead, Cadmium and Tin and is manufactured by Indium Corporation of America under the brand name "Indalloy 140". However, it should be understood that any conductive material that provides a deformable surface can be utilized.

To remove the portion of the conductive layer 26 overlying the photoresist layer 25, a conventional lift off process is utilized. This process removes the portion of the conductive layer 26 not adhered to the substrate 10. This is illustrated on FIG. 2. This results in the formation of a gate 28 contacting the pad 16 and a gate 30 contacting the pad 18. The thickness of the conductive layer 26 is such that the resulting thickness of the gates 28 and 30 have a height above the substrate 10 that exceeds that of any structure thereon. The upper surface of each of the gates 28 and 30 is irregular as a result of utilizing Indium alloy. In an alternate embodiment, the height of each of the gates 28 and 30 above the surface of the substrate 10 can be increased by placing the substrate 10 and gates 28 and 30 into an oven at a temperature above the reflow temperature thereof to allow the Indium alloy to soften and reflow. This occurs at a temperature of approximately 100° C. During this reflow process, the surfaces of the gates 28 and 30 exhibit a tendency to become convex in shape, thereby further increasing the height of the center portion of the gates 28 and 30 with respect to the remaining structure on substrate 10.

Figure 3:
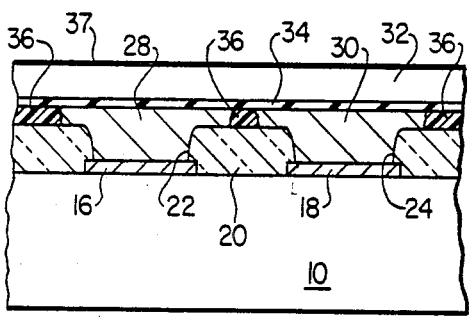
FIG. 3 illustrates a cross-sectional diagram of the combined substrate and superstrate with the deformable gates disposed therebetween.

Referring now to FIG. 3, there is illustrated a cross-sectional diagram of the substrate 10 with a superstrate adjoined thereto. The superstrate is formed from a layer 32 of Mercury Cadmium Telluride (MCT) upon which a layer of insulating material, preferably zinc sulfide 34 has been deposited. The MCT layer 32 is a very narrow bandgap photosensitive semiconductor. The ratio of Mercury to Cadmium to Tellurium is approximately 0.8:0.2:1.0 to yield a bandgap small enough (0.1 eV) to be bridged by 12 micron photons. The zinc sulfide layer 34 is a nonconductive dielectric layer that constitutes the insulator in the MiS device being fabricated. Pressure is applied to the combined superstrate and substrate and directed therebetween to cause the gates 28 and 30 to deform and be displaced laterally outward from the centers thereof. This causes the upper surface of each of the gates 28 and 30 to conform to the shape of the dielectric layer 34. To maintain the superstrate in contact with the substrate 10, a layer of epoxy 36 is "wicked" into the interstices of the combined device and allowed to cure to provide an adhesive attachment therefor. The epoxy is a low viscosity epoxy of the type manufactured by Epotek Corporation, part number "Epotek 330".

Figure 4:
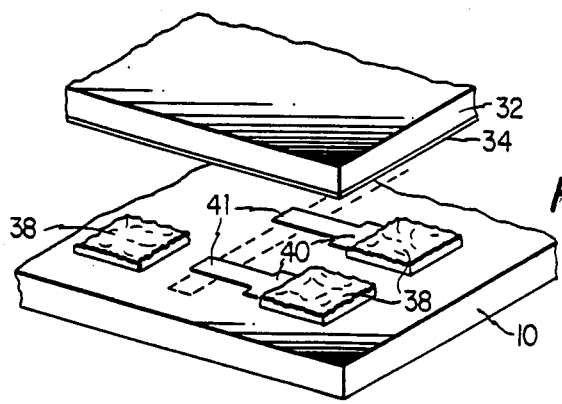
FIG. 4 illustrates an exploded view of the superstrate and substrate with the gates arranged in an array.

Referring now to FIG. 4, there is illustrated an exploded view of the superstrate and substrate, wherein like numerals refer to like parts in the various Figures. The substrate 10 has a plurality of gates 38 fabricated thereon in accordance with the process described above with reference to FIGS. 1–3. Each of the gates 38 in the array is associated with a contact pad 40 which extends outward therefrom. The contact pads 40 constitute the interface between the gates 38 and the switching elements of the array defined in the substrate 10. Each of these contact pads 40 is individually accessible from a remote location on the substrate 10 for application of a voltage thereto. This accessibility is facilitated by metal and polysilicon runs at various locations on the substrate 10 to supply control signals to the select switching elements and to receive the output therefrom. The distal ends of the contact pads 40 are the interface points with the associated switching elements and are designated by the reference numeral 41.

To place the surface of the dielectric layer 34 in contact with the upper surfaces of the gates 38, the superstrate is first placed thereon and then pressure applied to the upper surface of the MCT layer 34. This pressure is preferrably a distributed pressure such that one area of the superstrate is not subjected to a concentrated force which may cause mechanical or lattice damage to the superstrate materials. Application of a uniform pressure can be facilitated by utilizing a porous sponge-like material between a flat pressure application plate and the surface of the MCT layer 32. Use of this porous material allows certain areas to compress when subjected to a concentrated force, thereby dispersing this force to other areas of the MCT layer 32. By applying uniform pressure, physical contact between the lower surface of the dielectric layer 34 and each of the deformable pads 38 can be ensured.

The height of the deformable gates 38 above the surface of the substrate 10 and the separation between adjacent ones thereof prior to assembly of the array is a function of the deformability of the metal utilized. When the superstrate is applied thereto, adjacent ones of the gates 38 decrease in thickness and are displaced laterally outward towards each other. However, it is necessary to ensure that these gates do not contact each other. Therefore, both the initial thickness and the width of each of the gates 38 are designed to account for the dimensional change after deformation as a function of applied pressure. This results in a space being maintained which is subsequently filled with epoxy.

After the superstrate has been placed onto the substrate 10 and epoxied thereto, the thickness of the MCT layer 32 is reduced. As will be described hereinbelow, the photons enter the MCT layer 32 from the exterior side thereof and create optically generated minority carriers in a shallow layer, approximately one micron thick. These carriers must diffuse through the MCT layer and be collected in the MIS well at the interior surface of the layer 32. In order to facilitate this, the exterior surface of the MCT layer 32 is subjected to a polishing step. In the polishing step, the substrate is waxed to a glass lapping plug prior to beginning the thinning steps. The MCT layer 32 is lapped with three micron grit on glass down to about 70 microns in thickness, followed by lapping with a 0.3 micron grit on a polishing cloth until the scratches left from the three micron lap are gone. The MCT layer 32 is then polished, with half percent bromine-methanol on a pellon pad, down to 20 to 25 microns. A final polishing step, using one-eighth percent bromine-methanol solution, takes the MCT layer 32 down to approximately 12 microns in thickness. After thinning, a layer of zinc sulfide 37 is deposited on the exterior surface of the MCT layer 32 to provide passivation therefor and also serve as an anti-reflection coating. The thickness of the zinc sulfide layer 37 is approximately 10,000 Å.

Figure 5:
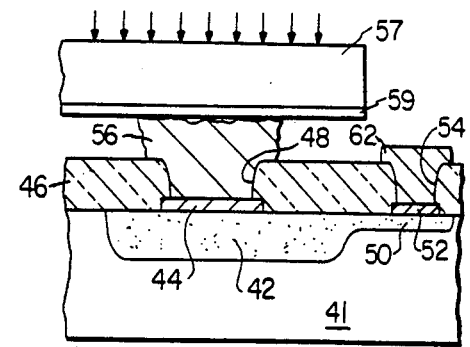
FIG. 5 illustrates a detail of one pixel of the photodetector array during deformation of the gates.

Referring now to FIG. 5, there is illustrated a cross-sectional diagram of a single MIS device. For illustrative purposes, a substrate 41 has a conductive area 42 defined therein which can be a heavily doped region within the substrate 41. The substrate 41 is a conventional semiconductor material. The conductive area 42 has a contact pad 44 formed in the middle portion thereof. A nitride layer 46 is formed on top of the substrate 41 with an access opening or via 48 formed therein to allow access to the contact pad 44. The conductive area 42 has an extended portion 50 that is disposed away from the contact pad 41 to a contact pad 52. The nitride layer 46 has an access opening or via 54 disposed therethrough to allow access to the contact pad 52. The access opening 54 allows external access to the contact pad 52. The contact pads 44 and 52 and the nitride layer 46 are fabricated by the processes described above.

A deformable gate 56 is formed in accordance with the method described above with reference to FIGS. 1-3 and in contact with the contact pad 44. A superstrate consisting of an MCT layer 57 and a dielectric layer 59 is disposed over the undeformed gate 56 with pressure applied thereto. The thickness of the MCT layer 57 is approximately 0.020 inches and the thickness of the dielectric layer 59 is approximately 1,000 Å resulting in a relatively rigid structure that allows the application of pressure. The pressure applied to the top of the MCT layer 57 is illustrated by a series of vertical arrows directed downward towards the substrate 41. In the initial state, the gate 56 has a thickness of approximately 2.0 microns above the surface of substrate 41. Once compressed, the conductive material of the gate 56 is displaced laterally and the thickness thereof decreases to approximately 1.5 microns. This is illustrated in FIG. 6, wherein like numerals refer to like parts in the two Figures.

Figure 6:
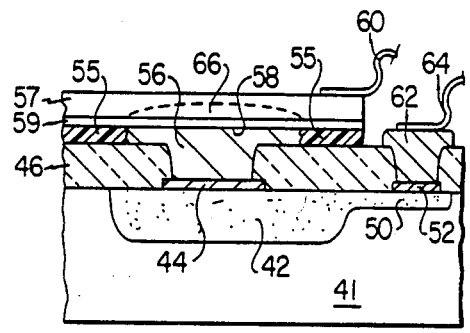
FIG. 6 illustrates a cross-sectional diagram of one pixel of the photodetector array after deformation of the conductive pad.

In FIG. 6, the gate 56 is shown deformed with an interface 58 formed between the upper surface of the deformed gate 56 and the lower surface of the dielectric layer 59. This interface 58 capacitively couples the gate 56 to the MCT layer 57. After deformation of the gate 56, a layer of epoxy 55 is wicked into the interstices of the device and then allowed to ours. After the epoxy layer 55 has cured, the thickness of the MCT layer 57 is decreased from 0.020 inches to approximately 12 microns by the thinning process described above.

An electrical contact 60 is made with the upper surface of the MCT layer 32 to provide one terminal of the MIS device. A conductive pad 62 is formed in communication with the contact pad 52 to allow contact with the conductive area 50 and a conductive terminal 64 attached to the pad 62. The conductive leads 60 and 64 allow an external voltage to be applied across the dielectric layer 59 at the interface 58. Although the electrical lead connections 62 and 64 are illustrated as separate contacts for an individual MIS device, an array of MIS devices is similar. For example, the substrate 10 of FIGS. 1-3 with the silicon processor and the array of switching elements contained therein is the functional equivalent of the conductive regions 42 and 50 and the electrical contact 62. The lead 60 attached to the upper surface of the MCT layer 57 can be paralleled in the embodiment of FIGS. 1-3 in one of two ways. It can either be a contact pad on the upper surface of the MCT layer 32 with a lead attached thereto or a connection formed through a via in the MCT layer to the semiconductor processor in the substrate 10.

Referring further to FIGS. 4 and 6, the operation of the MIS device will be described in more detail. When a voltage is applied across the interface 58 and the adjacent portion of the dielectric layer 59, a space charge region 66 is defined, which is termed an "MIS well". A capacitance results which is defined by the thickness of the dielectric layer 59, the dielectric constant thereof and the area of the space charge region 66. By varying the voltage, the size of the space charge region 66 can be changed and thus the capacitance thereof adjusted. The incidence of a photon of the appropriate wavelength causes a free carrier to be liberated from the lattice. Subsequently, the carriers diffuse to the space charge region 66 and are collected in the MIS well. These collected carries can be detected by various well known readout schemes, such as correlated double sampling.

Figure 2:
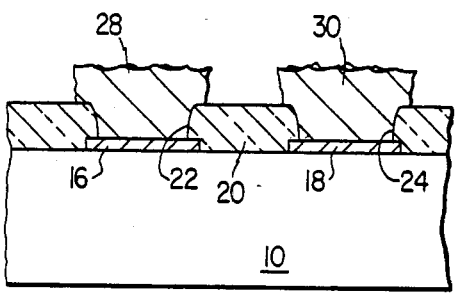
FIG. 2 illustrates a cross-sectional diagram of the substrate with the deformable gates defined by a lift patterning process.

The MIS gates that are formed in both the embodiments of FIGS. 1-3 and the embodiments of FIGS. 4-5 are dimensioned after deformation thereof to suit the application and are typically between one and four mils (1/1000th inch) on a side. In the preferred embodiment, the MIS gates are patterned to be rectangular or square in shape with an edge dimension of between one and two mils. The capacitance resulting from having a 1000 Å dielectric layer between the MCT layer and the gate is approximately $\frac{1}{3}$ picofarad per square mil. Of course, reduction in the thickness of the zinc sulfide insulating layer substantially increases the capacitance.

Figure 7:
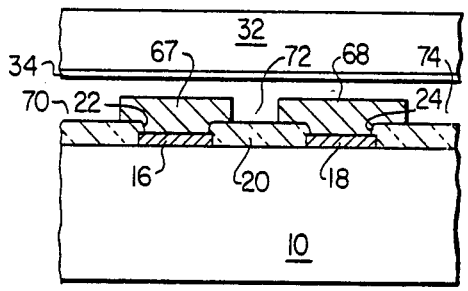
FIG. 7 illustrates an alternate embodiment of forming the MIS device utilizing nondeformable gates.

Referring now to FIG. 7, there is illustrated an alternate embodiment of the present invention, wherein like parts refer to like numerals in the various Figures. The substrate 10 with the silicon processor formed therein has contact pads 16 and 18 deposited thereon and the access openings 22 and 24 formed in the nitride layer 20. After this portion of the substrate has been processed in the manner described above with reference to FIGS. 1-6, a smooth layer of metal is deposited and patterned by conventional liftoff or etch processes to form a gate 67 in contact with the contact pad 16 and a gate 68 in contact with contact pad 18. The upper surface of gates 67 and 68 is smooth with each of the gates having a thickness of approximately 1.5 microns. However, it should be understood that the thickness of the gates 67 and 68 depends upon the surrounding topography of the substrate 10. For example, if a 32×32 array is surrounded by a topography that has a variance of 0.5 micron between the lowest point and highest point thereof, then there will be 1.0 micron between the highest point on the surface of the substrate and the upper surfaces of each of the gates associated with each detector element in the array.

The superstrate formed from the MCT layer 32 and the insulating layer 34 is placed adjacent the upper surfaces of the gates 67 and 68 to provide a capacitive coupling therebetween. As compared to the embodiment of FIGS. 1-6, there is no pressure applied to the interface between the gates 67 and 68 and the exterior surface of the insulating layer 34 nor are gates 67 and 68 deformed. However, there still is a capacitive element formed in association with each of the gates 67 and 68. To adhere the superstrate and substrate together, epoxy is wicked into areas 70, 72 and 74 to provide an adhesive force thereto. Since capacitance is a function of the distance between two conductive surfaces and the dielectric constant of the medium therebetween, it is only necessary to define the distance between the upper surface of each of the gates 67 and 68 and the lower surface of the MCT layer 32. This distance is defined by the thickness of the insulating layer 34 which, in the preferred embodiment, is approximately 1000 Å.

In summary, there has been provided a method for fabricating an MIS device utilizing a substrate with an array of switching elements defined therein and a superstate of passivated Mercury Cadmium Telluride disposed thereover. A plurality of deformable conductive gates are formed on the substrate and associated with each of the switching elements. A layer of insulating material is formed on the lower surface of the MCT layer in the superstrate and the superstrate is then pressed down onto the substrate to deform the gates. Deformation of the gates upon application of pressure between the superstrate and substrate capacitively couples the gate through the insulating layer to the MCT layer. Epoxy is then applied to the intersticies within the device to secure the two layers together and then the thickness of the MCT layer is reduced to shorten the path length for carriers created at the exterior surface of the MCT layer. Utilization of this technique requires no critical alignment between the substrate and superstrate.

Although the preferred embodiment has been described in detail, it should be understood that various changes, substitutions and alterations can be made therein without departing from the spirit and scope of the invention as defined by the appended claims.

What is claimed is:
1. A metal oxide silicon semiconductor, comprising:
   a substrate layer having an array of switching elements formed therein, each of the switching elements having outputs selectively connectable to a first external conducting terminal;
   a plurality of deformable conductive gates formed on the upper surface of the substrate, each of said gates in conductive contact with the inputs of an associated one of said switching elements;
   a layer of photosensitive semiconductor material;
   a layer of semiconductor dielectric material formed on the lower surface of said semiconductor layer, said dielectric layer in contact with the surface of said conductive gates opposite said substrate; said gates dimensioned such that the upper surface thereof is higher than the highest point on the topography of said substrate;
   a layer of epoxy disposed in the spaces between said gates, the upper exposed surface of said substrate and the exposed lower surface of said dielectric layer; and
   a second external conducting terminal attached to the surface of said semiconductor layer opposite said dielectric layer.

2. The metal oxide silicon semiconductor of claim 1 wherein said deformable conductive gates are comprised of Indium alloy.

3. The metal oxide silicon semiconductor of claim 1 wherein said semiconductor material comprises mercury cadmium telluride.

4. The metal oxide silicon semiconductor of claim 1 wherein said dielectric layer comprises zinc sulfide.

5. The metal oxide silicon semiconductor of claim 1 further including an electrically insulating layer in the interstices between said gates.

6. The metal oxide silicon semiconductor of claim 2 further including an electrically insulating layer in the interstices between said gates.

7. The metal oxide silicon semiconductor of claim 3 further including an electrically insulating layer in the interstices between said gates.

8. The metal oxide silicon semiconductor of claim 4 further including an electrically insulating layer in the interstices between said gates.

9. The metal oxide silicon semiconductor of claim 5 wherein said gates extend over said electrically insulating layer.

10. The metal oxide silicon semiconductor of claim 6 wherein said gates extend over said electrically insulating layer.

11. The metal oxide silicon semiconductor of claim 7 wherein said gates extend over said electrically insulating layer.

12. The metal oxide silicon semiconductor of claim 8 wherein said gates extend over said electrically insulating layer.

13. The metal oxide silicon semiconductor of claim 5 wherein said layer of epoxy is positioned on said electrically insulating layer.

14. The metal oxide silicon semiconductor of claim 6 wherein said layer of epoxy is positioned on said electrically insulating layer.

15. The metal oxide silicon semiconductor of claim 7 wherein said layer of epoxy is positioned on said electrically insulating layer.

16. The metal oxide silicon semiconductor of claim 8 wherein said layer of epoxy is positioned on said electrically insulating layer.

17. The metal oxide silicon semiconductor of claim 9 wherein said layer of epoxy is positioned on said electrically insulating layer.

18. The metal oxide silicon semiconductor of claim 10 wherein said layer at epoxy is positioned on said electrically insulating layer.

19. The metal oxide silicon semiconductor of claim 11 wherein said layer of epoxy is positioned on said electrically insulating layer.

20. The metal oxide silicon semiconductor of claim 12 wherein said layer of epoxy is positioned on said electrically insulating layer.

* * * * *